(12) United States Patent
Loose

(10) Patent No.: US 6,759,641 B1
(45) Date of Patent: Jul. 6, 2004

(54) IMAGER WITH ADJUSTABLE RESOLUTION

(75) Inventor: Markus Loose, Thousand Oaks, CA (US)

(73) Assignee: Rockwell Scientific Licensing, LLC, Thousand Oaks, CA (US)

( * ) Notice: Subject to any disclaimer, the term of this patent is extended or adjusted under 35 U.S.C. 154(b) by 0 days.

(21) Appl. No.: 09/671,409

(22) Filed: Sep. 27, 2000

(51) Int. Cl.[7] .............................................. H01L 27/00
(52) U.S. Cl. ............................... 250/208.1; 250/214 R; 348/308
(58) Field of Search .......................... 250/208.1, 214 R, 250/214 A, 214 LA, 214 LS, 214 SW; 348/307, 308, 309, 310

(56) References Cited

U.S. PATENT DOCUMENTS

| | | | | |
|---|---|---|---|---|
| 4,948,966 A | * | 8/1990 | Arques et al. ............ | 250/208.1 |
| 5,262,871 A | * | 11/1993 | Wilder et al. ............... | 348/307 |
| 5,812,191 A | * | 9/1998 | Orava et al. ................. | 348/308 |
| 5,955,753 A | * | 9/1999 | Takahashi .................... | 257/292 |
| 6,091,449 A | * | 7/2000 | Matsunaga et al. ......... | 348/308 |
| 6,249,618 B1 | * | 6/2001 | Hou ............................ | 382/312 |

FOREIGN PATENT DOCUMENTS

EP          0757476 A2        7/1996

* cited by examiner

*Primary Examiner*—David V. Bruce
*Assistant Examiner*—Chih-Cheng Glen Kao
(74) *Attorney, Agent, or Firm*—Koppel, Jacobs, Patrick & Heybl

(57) ABSTRACT

A photodetector array includes a plurality of photodetectors, preferably photodiodes, coupled to a respective plurality of addressable interface circuits. At each pixel, a switching circuit configures neighboring ones of the photodetectors into pixels by summing multiple photodetector signals into an aggregated pixel output signal. The switching circuit is electronically switchable to aggregate said photodetector signals according to at least two different selectable pixelization schemes with differing resolution.

6 Claims, 4 Drawing Sheets

IMAGER WITH ADJUSTABLE RESOLUTION

BACKGROUND OF THE INVENTION

1. Field of the Invention

This invention relates to photodetectors generally and more specifically to two-dimensional, integrated semiconductor image sensors.

2. Description of the Related Art

Small, integrated semiconductor image sensors are widely used to capture images and convert them to electronic signals, as for example in video cameras or electronic still-frame cameras. A variety of different digital image array formats are in current use, which provide a variety of different pixel densities. For example, proposed standards for High Density Television (HDTV) include pixel arrays of 1920 by 1080, 1280 by 720, or the lower resolution 640 by 360 (columns by rows).

For some applications, it is desirable to convert from one image format to another: for example, to convert a 1280 by 720 image into 640 by 360 format. Several methods are available to accomplish such a conversion. Conventional methods for converting formats include optical windowing, subsampling, and pixel aggregation by software manipulation. Each method has attendant disadvantages.

Optical windowing is perhaps the simplest and most obvious method of changing digital image formats. This method is simply using a smaller portion of the sensor array, for example the center portion, to capture the same image which was previously projected over the entire array. Although conceptually simple, this method is quite clumsy in practice. In order to shift and resize the image at the image plane, optical components must be moved and/or substituted to change the optical format. Such changes are difficult and expensive, and it is difficult to maintain adequate optical alignment. This solution is almost as difficult as simply substituting a completely new camera with the new format.

Subsampling of the image data is more convenient, as it does not require motion of physical, optical components. In this method, one converts from a higher density to a lower density format either during or after image acquisition, for example by software methods. After the image is digitized, for example, to change from 1280 columns to 640 columns, one can subsample by simply discarding every odd numbered column. One disadvantage to this method is that substantial information can be discarded, thereby compromising image quality. For example, if a highly periodic image were presented, in which every other column had a luminance of near maximum, that information might be discarded by subsampling. The resulting image would not accurately represent the original source image.

An alternative method, pixel aggregation, seeks to mitigate problems which accompany subsampling. Instead of subsampling, pixel aggregation averages adjacent pixels by software manipulation. One problem with this method is that only integer multiples of pixels can be aggregated. For example, one cannot easily convert 1920 rows to 1280 rows by aggregating, as the ratio 2/3 is not a whole integer ratio. Interpolation can be used, but some information is sacrificed by interpolation. Furthermore, computed interpolation is time consuming, particularly for large image arrays.

U.S. Pat. No. 5,262,871 teaches another alternative wherein the random addressing of pixels enables the readout of pixels located in selected regions of interest. In this method, relatively large groups of pixels are read out simultaneously and the resulting signals can be merged into superpixel signals. Once an area of interest is located, the number of pixels read during each cycle may be reduced to provide higher resolution, lower speed readout of the area of interest. Unfortunately, this method uses signal accumulation via charge aggregation on the signal bus. No means is provided for mitigating the attendant noise. The signal readout from each pixel is passive: i.e., no amplification is provided for either noise minimization or signal enhancement. Instead, the prior method uses digital control logic to selectively or collaterally address the pixels of interest.

SUMMARY OF THE INVENTION

In view of the above problems, the present invention provides a photodetector array with hardware-switchable resolution. The array includes a plurality of photodetectors, preferably photodiodes, coupled to a respective plurality of addressable interface circuits. At each pixel, a switching circuit configures neighboring ones of the photodetectors into pixels by summing multiple photodetector signals into an aggregated pixel output signal. The switching circuit is electronically switchable to aggregate said photodetector signals according to at least two different selectable pixelization schemes with differing resolution.

Preferably, control signals for the switching circuit are fabricated in polycrystalline silicon disposed underneath and in the shadows of metallization paths, for example addressing lines. Thus, no photoactive surface is consumed and fill factor is not diminished by the addition of the control signal paths.

In one particular embodiment, photodiodes are switchable into (1) pairs, or (2) groups of three neighboring photodiodes, in response to switching control signals. Thus, resolution is hardware switchable between (1) a maximum resolution, or (2) 2/3 of maximum resolution.

These and other features and advantages of the invention will be apparent to those skilled in the art from the following detailed description of preferred embodiments, taken together with the accompanying drawings, in which:

DETAILED DESCRIPTION OF THE INVENTION

The invention is first described in the exemplary context of a simple and practical particular embodiment which provides an CMOS interfaced, photodiode imaging matrix with vertical resolution switchable between an original pixel size and a larger, 3/2 pixel size. This embodiment is typical and useful to switch an imager between 1080 rows and 720 rows, (or between 1920 and 1280 columns) which is useful for HDTV applications. However, the invention is not limited to this particular pixel ratio, but rather can be generalized to transform resolution by other ratios, as described below.

Figure 1:
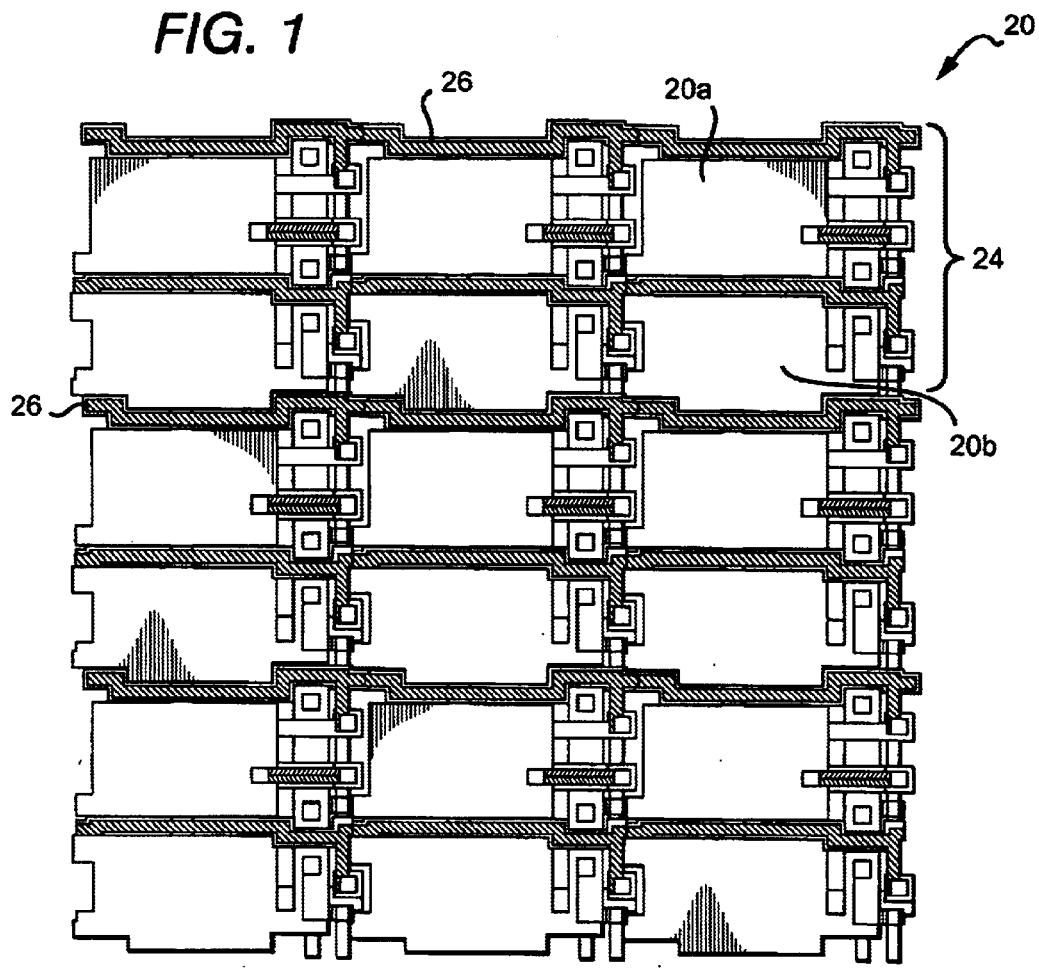
FIG. 1 is a plan view of a representative portion of an imaging array in accordance with the invention.

FIG. 1 shows a representative portion (greatly magnified in scale) of a typical imaging array in accordance with the invention. A three by three (3×3) section of pixels is represented. Each single pixel such as 20 includes at least two photodiodes such as 20a and 20b, together with addressing and interface electronics 24 which are suitably fabricated in CMOS. The interface electronics preferably include buffering, amplification and addressing circuits. Horizontal metallized circuit pathways 26 are shown in the interstices between the photodiodes. Typical dimensions are shown: a typical pixel size of 5×5 microns is suitable, although higher densities may be possible and might be desirable for some applications. Although only a small matrix is shown, for clarity, the layout is typically useful for fabricating large matrices such as 1920×1080 pixels for optical imagers.

Figure 2A:
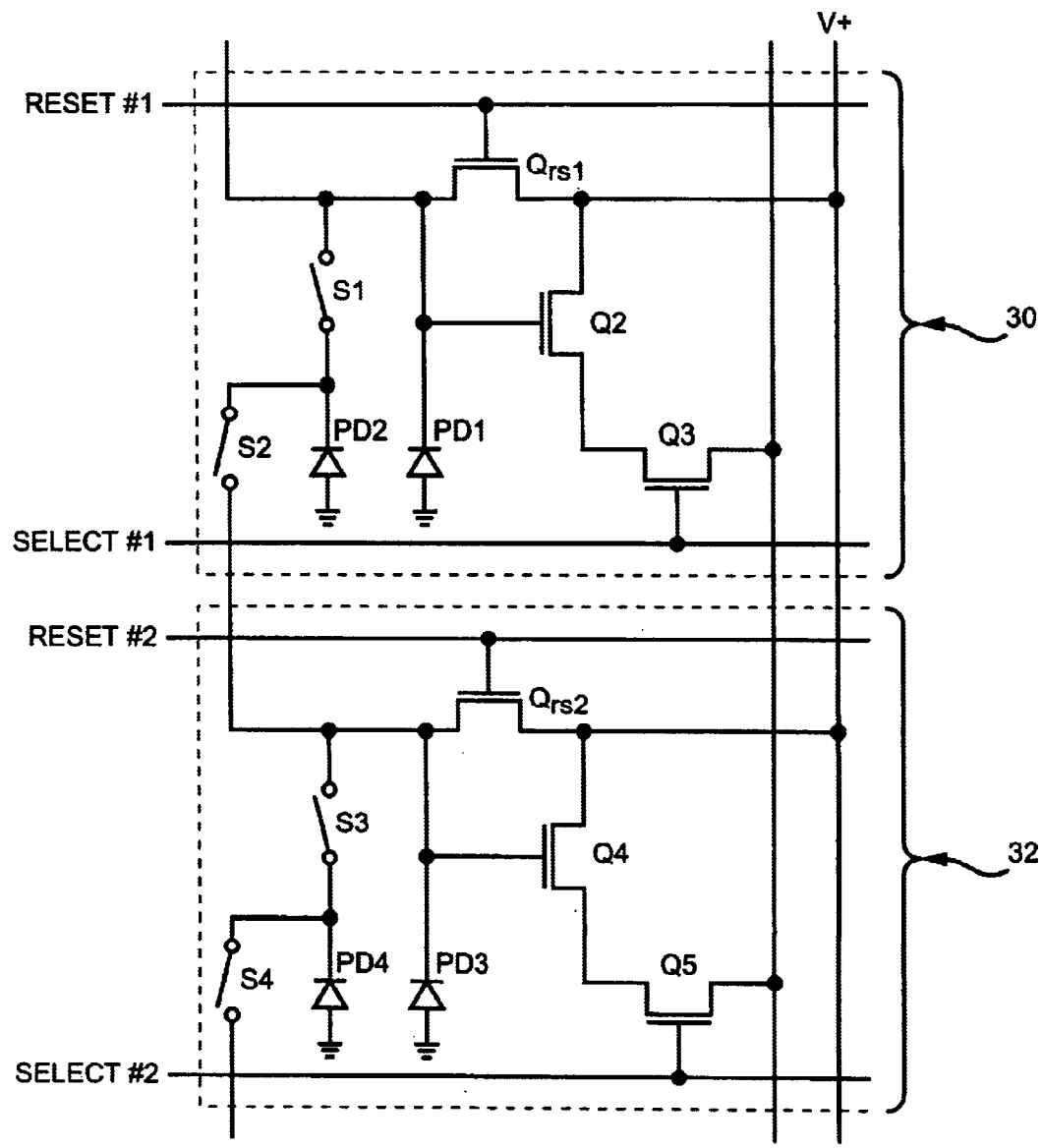
FIG. 2a is a schematic diagram of a switching circuit in accordance with the invention.

FIG. 2a schematically shows the circuits of two exemplary pixels 30 and 32, each in accordance with the invention. Each pixel includes two photodiodes: PD1 and PD2 pertain to pixel 30, while PD3 and PD4 pertain to pixel 32. (The photodiodes PD1 and PD2 correspond to 20a and 20b on the plan of FIG. 1.) A reset FET $Q_{rs1}$ has its source connected to the cathode of PD1 and gate connected to a reset line RESET #1. Thus, a signal on RESET #1 can be used to reset the circuit by discharging any charge accumulated from photodiode PD1. Buffer/interface FETs Q2 and Q3 are connected in a source follower/common gate two stage buffer amplifier circuit, which allows the photodiode voltage to be read when a select signal SELECT #1 is set high. When the interface amplifier is off, charge from photodiodes PD1 and PD2 accumulates across the intrinsic capacitance (primarily that of the PDs themselves) until it is read by enabling SELECT #1. Similarly, pixel 32 includes a reset FET $Q_{rs2}$ connected to PD3 which is controlled by a reset line RESET #2, and buffer/interface FETs Q4 and Q5 which allow the voltage on photodiode PD3 to be read when a select signal SELECT #2 is set high.

Switches S1 and S2 are preferably high impedance, electronic switches (suitably CMOS FET switches) which allow the photodiodes PD1 and PD2 to be connected in either of two configurations, as selected by control signals. For example, both photodiodes from pixel 30, PD1 and PD2, can be connected in parallel, so that the pixel 30 accumulates signal from both photodiodes. The circuit in each (addressable) pixel is electronically switchable to the alternate switch position. With the switches in the alternate position, the photodiodes PD3 and PD4 can be connected so that PD4 is connected in parallel with photodiodes PD1 and PD2 (part of neighboring pixel 30).

Figure 2B:
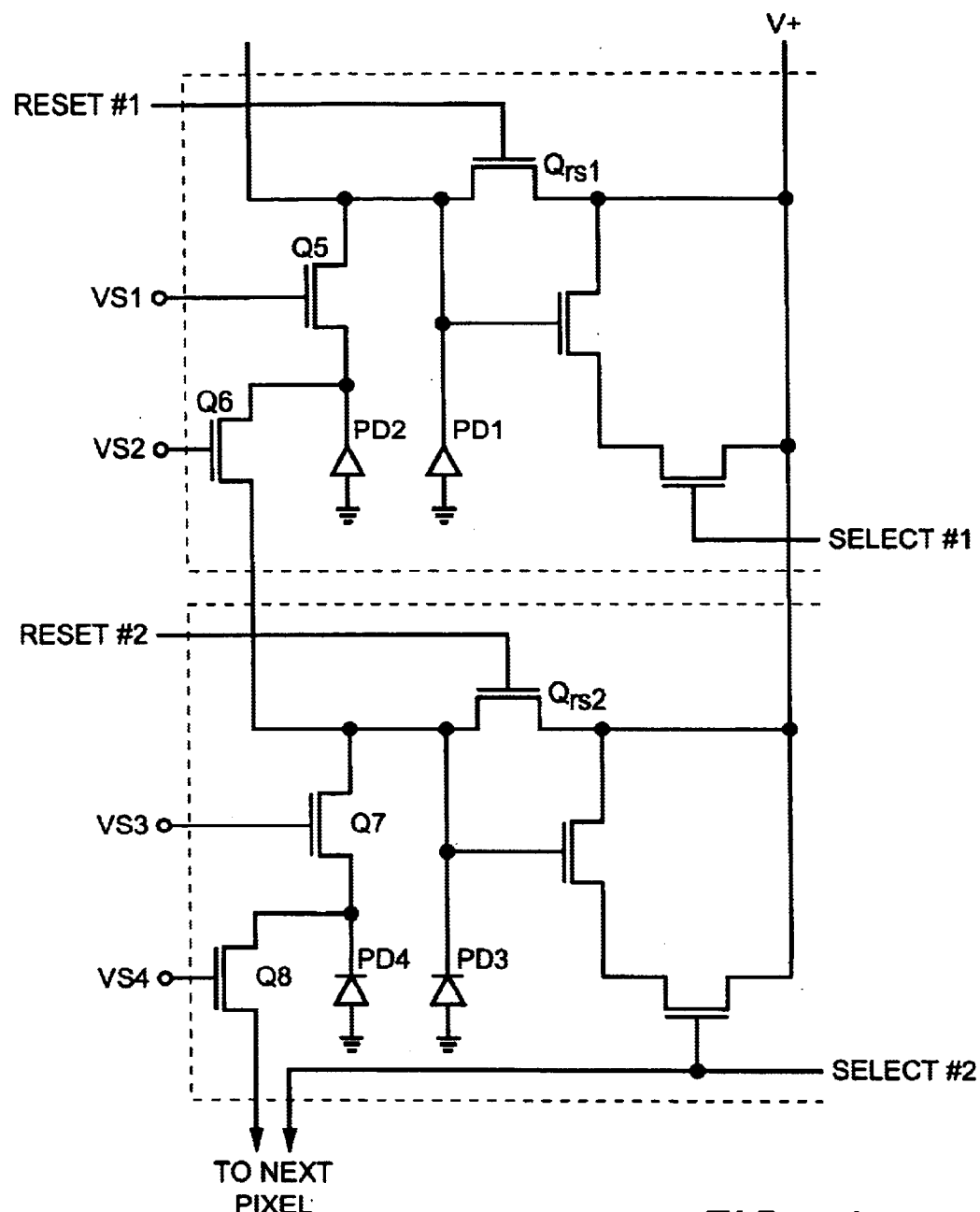
FIG. 2b is a schematic diagram of a particular circuit which implements FIG. 2a with FET switches.

A particular circuit realization of FIG. 2a is shown in FIG. 2b. FETs Q5 and Q6 act as switches S1 and S2, respectively, to switch the photodiode signals as described in connection with FIG. 2a. The switching of pixel 30 is controlled by control signals VS1 and VS2 applied to the gates of Q5 and Q6. Similarly, the switching of pixel 32 is controlled by control signals VS3 and VS4, which control FET switches Q7 and Q8, respectively. Pixel 32 is identical to 30 in its interface and detection circuitry, and indeed all the pixels in an imaging matrix may suitably include substantially the same circuit, although in operation the switches S1 and S2 may be differently set for various pixels.

Figure 3:
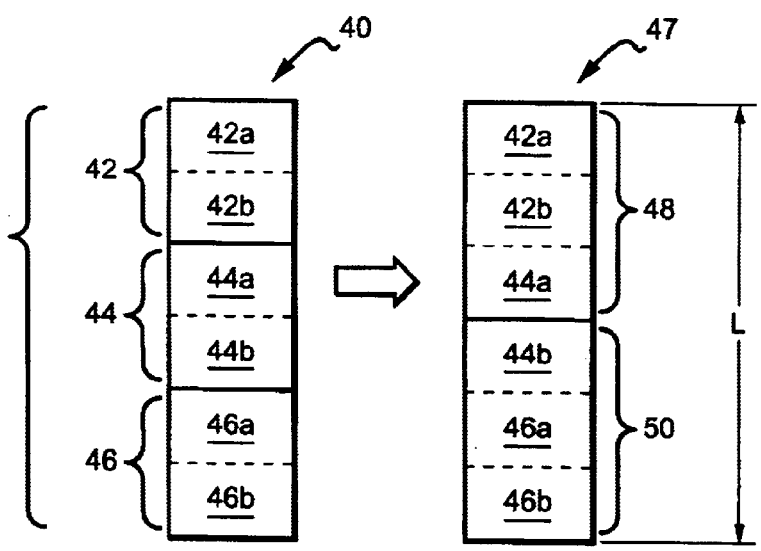
FIG. 3 is another simplified plan view of a representative portion of the imaging array, illustrating two alternate, selectable groupings of photodiodes which are provided by one embodiment of the invention.

The switching circuit of FIG. 2a (and FIG. 2b) allows a portion (in one embodiment, half) of the photo-active area of a detector pixel to be switched—dynamically reallocated—to a neighboring pixel. This allows electronically controlled, hardware switching of the imaging matrix resolution level by the following method illustrated in FIG. 3. Three pixels in a matrix are shown generally at 40. Each pixel in the imaging matrix includes two (or more) subpixels, each including a photodiode. Three typical pixels are shown: photodiodes (subpixels) 42a and 42b make up pixel 42, 44a and 44b make up pixel 44, and so forth. For a maximum resolution setting, the detector is switched so that photodiode 42a and 42b are connected in parallel, 44a and 44b in parallel, etc.

When it is desired to switch to lower vertical resolution, control signals to the pixels (corresponding to VS1–VS4 in FIG. 2b) are activated to switch the connections of the photodiodes 42a, 42b, 44a, 44b, 46a, and 46b. Instead of accumulating signals by pairs as shown at 40, the six photodiodes are connected in the grouping shown at 47. The photodiode 44a is connected in parallel with 42a and 42b, making up an effective pixel 48; similarly, 44b, 446a, and 46b make up an effective pixel 50 including the signals from three photodiodes. This reorganization is of course repeated across the imaging array. Thus, the resolution of the array is effectively switched from 3 pixels in the length L to two pixels (of 3/2 pixel effective height) in the same length l. This switching effects a resolution reduction by a factor of 2/3.

Obviously, the circuit and method of the invention are not limited to resolution changes by a 2/3 factor, but can be generalized to other ratios. The 2/3 reduction is highly practical and lends itself to clear explanation. However, the pixel photodiodes need not be equal in area. Masking techniques can be used to produce any ratio of photodiode area, and different areas can be masked onto different pixels in an array (of arbitrary pattern). For example, fractional areas can be imposed on the photodiodes in an n modulo m scheme, allowing transformation of resolution by a factor of m/n in at least one dimension of the matrix. Specifically, in one scheme the top photodiode of the nth pixel (ordered sequentially from the top) should have area proportional to n modulo m times pixel pitch, to accomplish a m/n switching of resolution.

Figure 4:
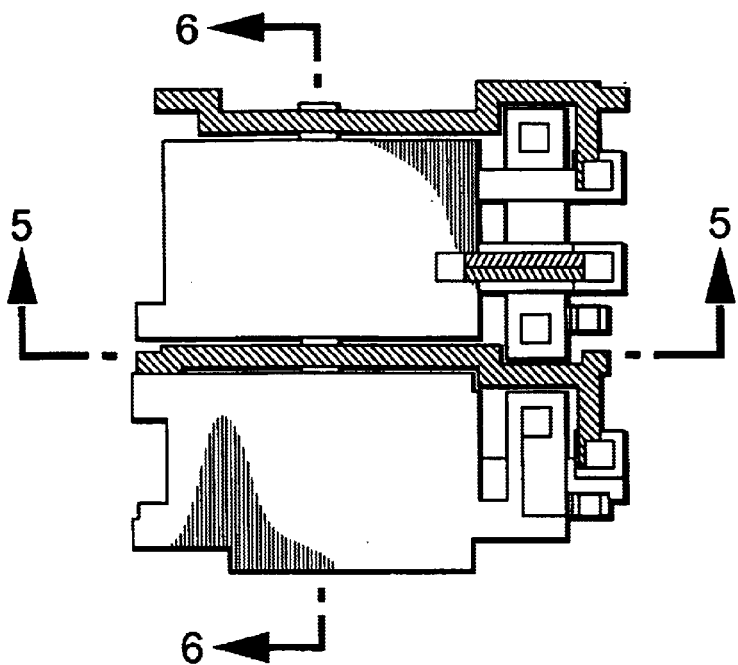
FIG. 4 is a more detailed plan view of a representative pixel of the array.
Figure 5:
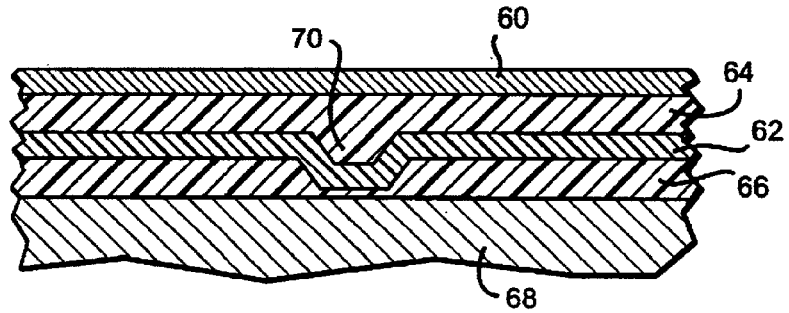
FIG. 5 is a cross-sectional view taken along section line 5 in FIG. 4, showing a suitable semiconductor switch structure for use in the invention.
Figure 6:
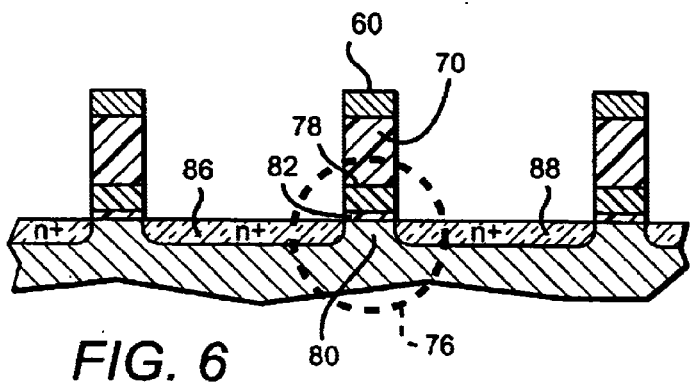
FIG. 6 is another cross-sectional view, taken along section line 6 in FIG. 4, further showing the semiconductor switch structure of FIG. 5.

FIGS. 4, 5 and 6 show one particularly advantageous physical layout for the electronic switch (s1 or s2), which maintains efficient usage (fill factor) for the photodetector matrix. FIG. 4 shows a typical pixel, somewhat enlarged in relation to FIG. 1, to show more detail of a suitable physical semiconductor layout. The surface of the cathodes of PD1 and PD2 occupy the largest portion of the pixel area and are suitably doped with N+ dopant. Interface electronics 24 (suitably CMOS FETs) are also shown, along with metallized circuit traces 60 for row addressing and/or reset control.

The section of FIG. 5 is through an area of the chip which is superficially covered (shadowed) by a metallized circuit path 60, and is thus not available for photodetection area in any case. Under the metallization layer 60 lies a preferably polycrystalline silicon (or generally, semiconductor) layer 62, separated and insulated from the metal layer 60 by an oxide layer 64. The polycrystalline silicon layer 62 provides a polysilicon branch for the control inputs (VS1 and VS2 in FIG. 2b) for switching resolution settings. Under the polysilicon layer 62 lies another insulating oxide layer 66, which separates the polysilicon layer 62 from the underlying p doped substrate 68. The oxide layer 66 is masked during fabrication to provide a contact area for a switch transistor (FET) 70. Of course, metallized branches could alternatively be used for the control input branches, but an additional layer of metallization would be required.

The switch transistor 70 is more easily seen in cross section in FIG. 6 (taken perpendicular to FIG. 5). The conventional fabricated cross section of an FET switch is easily seen within outline 76, with a gate 78, channel region 80, oxide insulating layer 82, and photodiode (n+doped) regions 86 and 88 (the cathodes of PD1 and PD2) which act as source and drain. Thus voltage applied to polycrystalline gate 82 switches the FET on and connects the adjacent photodiode regions 86 and 88.

The arrangement of FIGS. 4, 5 and 6 is advantageous in several respects. First, the control input lines for switching the photodiodes are disposed beneath (but are electrically isolated from) metallization lines 60. Preferably the control input lines are entirely in the shadow of the metallization lines. The metallization lines 60 are required for addressing the matrix, thus would be present even in conventional imaging arrays. Thus, the control input lines do not consume additional surface space or otherwise subtract space which could be used for photo-active photodiode surface. High fill factor is thus facilitated. Second, the use of polycrystalline silicon is appropriate for the switch control lines because it is already used for other devices, thus does not require an extra fabrication step. Polycrystalline material is adequate for the control input lines because, in most applications, switching between resolution modes will be infrequent and will not require high speed switching. Thus, the relatively high resistance of polycrystalline material does not forbid its use for switching control (of resolution). Other fabrication techniques and layouts could be employed, with some increase in cost and/or some sacrifice of chip fill factor.

In addition to applications where selectable resolution is required to fit a format, the invention is advantageous in other applications. For example, a photodetector may be required to work at both high and low frame speeds; or it might be desired to operate in both high and low light conditions. Selection of larger pixel size/lower resolution will facilitate integrating sufficient photodiode charge faster, thus is suited to low light or high speed applications. On the other hand, use of smaller pixels will produce better resolution at the expense of sensitivity and speed. The selectable resolution of the invention can accommodate multiple needs as required, with the same imager.

Although the invention has been illustrated in an embodiment in which each pixel includes two subpixels (each including a photodiode), higher numbers of subpixels could be used. However, the embodiment described is particularly useful and is suited to fabrication of common, desirable arrays: for example, an array switchable between 1920 rows and 1080 rows, or one switchable between 1080 and 720 columns.

While several illustrative embodiments of the invention have been shown and described, numerous variations and alternate embodiments will occur to those skilled in the art. The geometry of the photodetector array could be varied, or the geometry of the individual photodiode regions. Various switching devices could be substituted for the photodiode switches. Any ratio of pixel resolutions could be provided, by appropriate masking and addressing schemes. Pixels could be further subdivided into more than two subpixels (each including a photodiode and a switch), with routing switches to select their combination according to various multi-diode configurations. Such variations and alternate embodiments are contemplated, and can be made without departing from the spirit and scope of the invention as defined in the appended claims.

I claim:

1. A photodetector array comprising a plurality of addressable active pixels, each pixel comprising:
    at least two photodiodes arranged such that their outputs are switchably connected to a common pixel node;
    a switching circuit which allows switching of at least one of said photodiodes between a first circuit and a second circuit;
    wherein said first circuit directly combines the outputs of said at least two photodiodes in parallel, and said second circuit directly combines the output of said at least one of said photodiodes in parallel with the output of a photodiode of a neighboring pixel in the array, whereby said array is switchable between a high resolution and a low resolution pixel configuration, each pixel having an intrinsic capacitance which stores said combined photodiode outputs prior to their being read out, and
    an addressing circuit which enables the combined photodiode outputs stored on said pixel's intrinsic capacitance to be read out in response to an address input.

2. The photodetector array of claim 1, wherein said switching circuit includes active semiconductor switching devices.

3. The photodetector array of claim 2, wherein said switching devices are field effect transistors.

4. The photodetector array of claim 1, wherein said at least two photodiodes consist of two photodiodes.

5. The photodetector array of claim 1, wherein said array is switchable between 1920 rows and 1080 rows.

6. The photodetector array of claim 5, wherein said array is switchable between 1080 and 720 columns.

* * * * *